(12) United States Patent
Shirakata et al.

(10) Patent No.: US 11,049,682 B2
(45) Date of Patent: Jun. 29, 2021

(54) ELECTRIC-POWER CONVERSION APPARATUS

(71) Applicant: Mitsubishi Electric Corporation, Tokyo (JP)

(72) Inventors: Yuji Shirakata, Tokyo (JP); Kenta Fujii, Tokyo (JP); Masahiro Ueno, Tokyo (JP); Tomoaki Shimano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/634,687

(22) PCT Filed: Aug. 30, 2017

(86) PCT No.: PCT/JP2017/031057
§ 371 (c)(1),
(2) Date: Jan. 28, 2020

(87) PCT Pub. No.: WO2019/043806
PCT Pub. Date: Mar. 7, 2019

(65) Prior Publication Data
US 2020/0234905 A1 Jul. 23, 2020

(51) Int. Cl.
*H01H 85/10* (2006.01)
*H01H 85/02* (2006.01)
(Continued)

(52) U.S. Cl.
CPC ........ *H01H 85/10* (2013.01); *H01H 85/0241* (2013.01); *H01H 85/165* (2013.01);
(Continued)

(58) Field of Classification Search
CPC .. H01H 85/10; H01H 85/0241; H01H 85/165; H01H 85/18; H01H 85/38;
(Continued)

(56) References Cited

U.S. PATENT DOCUMENTS 3,962,782 A * 6/1976 Williamson ........... H01H 69/02
29/623
4,067,103 A * 1/1978 Ciesmier ................ H01H 69/02
29/417
(Continued)

FOREIGN PATENT DOCUMENTS

JP 57-92736 A 6/1982
JP 60-127630 A 7/1985
(Continued)

OTHER PUBLICATIONS

International Search Report for PCt/JP2017/031057 dated Nov. 21, 2017 [PCT/ISA/210].
(Continued)

*Primary Examiner* — Stephen S Sul
(74) *Attorney, Agent, or Firm* — Sughrue Mion, PLLC; Richard C. Turner

(57) ABSTRACT

There is provided an electric-power conversion apparatus in which smoke emission, a burnout, and short-circuiting can be suppressed even when a fuse portion is melted by an excessive current and in which it is made possible that heat generated in the fuse portion is less likely to be transferred to the electric power semiconductor device. The electric-power conversion apparatus includes a fuse portion formed in an electrode wiring member, a fuse resin member that covers the fuse portion, and a sealing resin member that seals an electric power semiconductor device and the fuse portion in a case. Along a current-flowing direction, the fuse portion includes an upstream-side first step portion whose cross-sectional area is smaller than that of the portion at the upstream side thereof, a second step portion whose cross-sectional area is smaller than that of the upstream-side first step portion, and a downstream-side first step portion whose cross-sectional area is larger than that of the second step
(Continued)

portion but is smaller than that of the portion at the downstream side thereof.

11 Claims, 9 Drawing Sheets

(51) Int. Cl.
    *H01H 85/165*     (2006.01)
    *H01H 85/18*     (2006.01)
    *H01H 85/38*     (2006.01)
    *H01L 23/62*     (2006.01)
    *H02M 7/48*     (2007.01)

(52) U.S. Cl.
    CPC ............ *H01H 85/18* (2013.01); *H01H 85/38* (2013.01); *H01L 23/62* (2013.01); *H02M 7/48* (2013.01); *H01H 2085/0283* (2013.01)

(58) Field of Classification Search
    CPC ............ H01H 2085/0283; H01H 85/08; H01L 23/62; H01L 23/36; H01L 23/49562; H01L 23/49524; H01L 23/049; H01L 23/24; H01L 23/3135; H01L 23/495; H01L 2224/32245; H01L 2224/48247; H02M 7/48; H02M 1/00
    USPC .................................................. 337/290, 295
    See application file for complete search history.

(56) References Cited

U.S. PATENT DOCUMENTS

| | | | | |
|---|---|---|---|---|
| 4,099,320 A | * | 7/1978 | Schmidt, Jr. ............ | H01H 69/02 29/414 |
| 4,099,321 A | * | 7/1978 | Aryamane ............. | H01H 69/02 29/417 |
| 5,068,706 A | | 11/1991 | Sugita et al. | |
| 5,682,057 A | * | 10/1997 | Kuriyama ............ | H01H 37/761 257/529 |
| 6,046,665 A | * | 4/2000 | Oh ......................... | H01H 85/10 337/181 |
| 9,865,537 B1 | * | 1/2018 | Male ..................... | H01L 23/315 |
| 9,892,880 B2 | * | 2/2018 | Schmidt ................. | H01H 69/02 |
| 2001/0048148 A1 | * | 12/2001 | Koyama ........... | H01L 23/49562 257/666 |
| 2007/0210414 A1 | * | 9/2007 | Iwamoto ............. | H01L 23/5329 257/529 |
| 2008/0029289 A1 | * | 2/2008 | Amerpohl ............ | H02G 15/064 174/73.1 |
| 2008/0048820 A1 | | 2/2008 | Matsumura et al. | |
| 2013/0062724 A1 | * | 3/2013 | Tokuyama .............. | H01L 24/33 257/499 |
| 2015/0294828 A1 | * | 10/2015 | Burge .................... | H01H 85/38 337/274 |
| 2015/0295489 A1 | | 10/2015 | Imai | |
| 2016/0155537 A1 | * | 6/2016 | Manabe .................... | B32B 1/08 174/107 |
| 2020/0211802 A1 | * | 7/2020 | Fujii .................. | H01H 85/0241 |

FOREIGN PATENT DOCUMENTS

| | | |
|---|---|---|
| JP | 63-221657 A | 9/1988 |
| JP | 11111153 A | 4/1999 |
| JP | 2003-068967 A | 3/2003 |
| JP | 2003-317605 A | 11/2003 |
| JP | 2008-053163 A | 3/2008 |

OTHER PUBLICATIONS

Communication dated Jun. 30, 2020, from the Japanese Patent Office in application No. 2019-538805.
Office Action dated Sep. 10, 2020 in Indian Patent Application No. 201927052385.

* cited by examiner

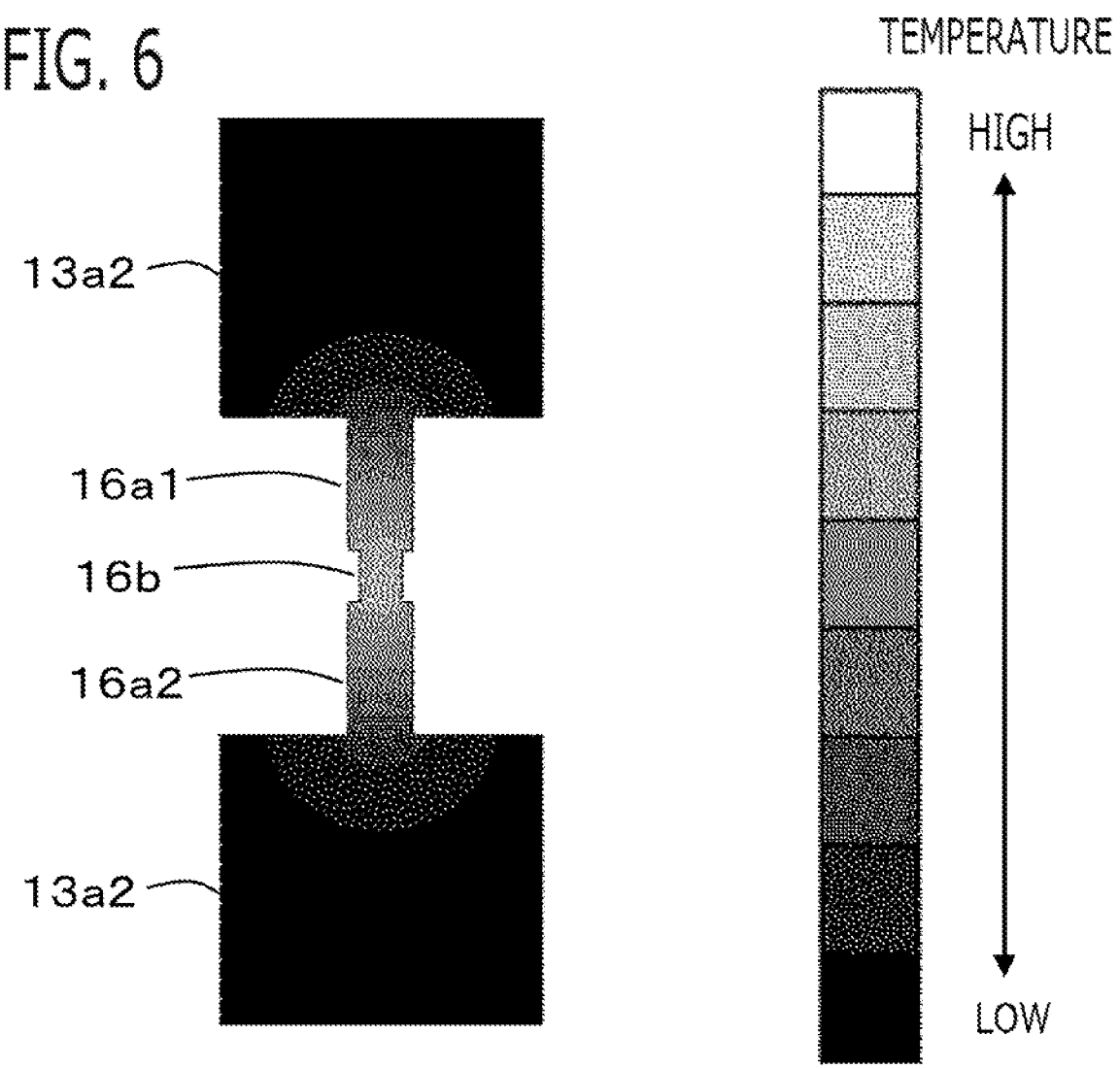

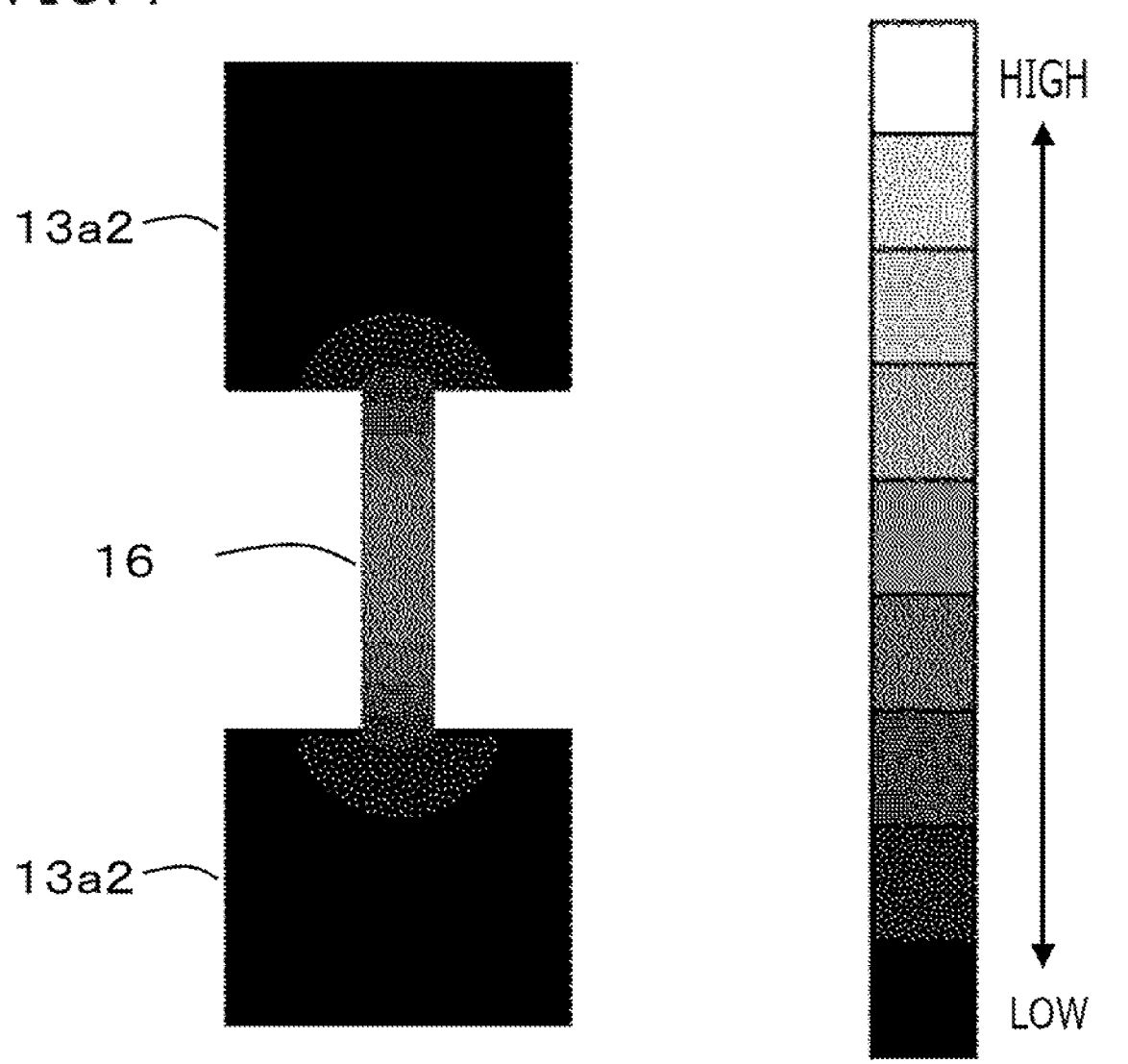

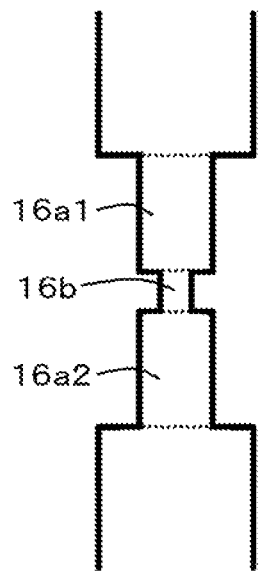 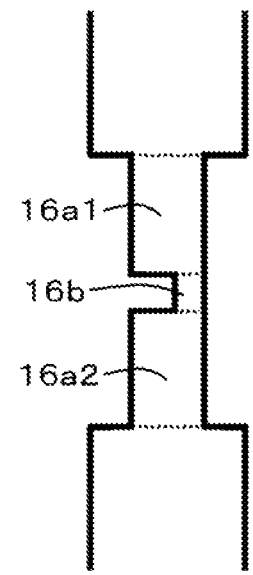 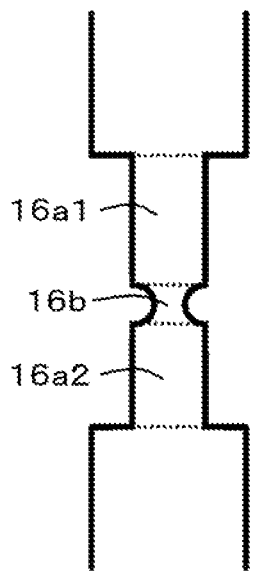 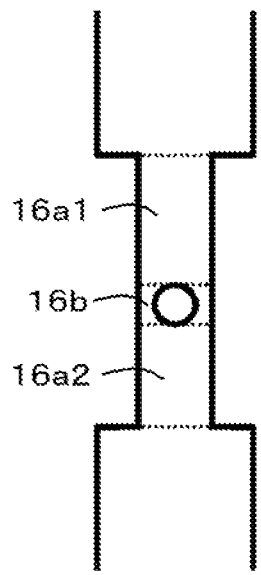
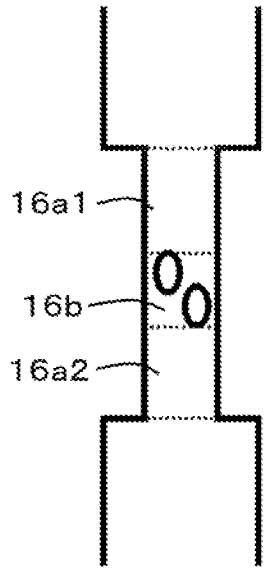 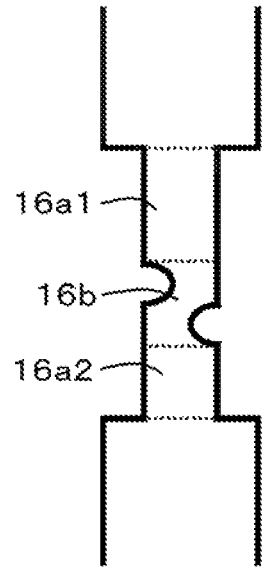 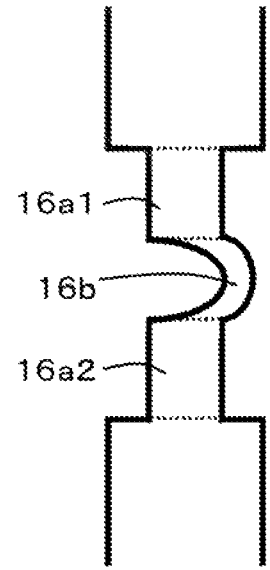

ELECTRIC-POWER CONVERSION APPARATUS

CROSS REFERENCE TO RELATED APPLICATIONS

This application is a National Stage of International Application No. PCT/JP2017/031057 filed Aug. 30, 2017.

TECHNICAL FIELD

The present disclosure relates to an electric-power conversion apparatus in which a resin member seals an electric power semiconductor device in a case.

BACKGROUND ART

In recent years, in the automobile industry, vehicles such as a hybrid automobile and an electric automobile, each of which utilizes a motor as a driving power source, have actively been developed. An inverter for driving the motor utilizes a battery as a power source so as to supply a high-voltage driving electric power to the motor. Moreover, a resin-sealing-type electric power semiconductor device is utilized in the inverter; thus, in the field of power electronics, the importance of an electric-power conversion apparatus, as a key device, is increasing more and more.

The electric power semiconductor device utilized in the inverter and other constituent components are integrally sealed with resin. In such an electric-power conversion apparatus, when while electric power is supplied from the battery, a short-circuit failure occurs in an electronic component such as an electric power semiconductor device or a smoothing capacitor included in a snubber circuit, an excessive short circuit current flows. For example, when due to a malfunction of a gate driving circuit in an inverter control circuit, upper and lower arms of the inverter are short-circuited, an excessive current flows in the electric power semiconductor device and hence a short-circuit failure occurs.

When in a short-circuit state, connection of a relay for linking the battery with a motor driving circuit or continuation of the connection makes a large current cause the electric-power conversion apparatus to emit smoke and to burn out. In addition, it is conceivable that due to the flow of an excessive current that exceeds the rating, the battery connected with the motor-driving inverter is damaged. In order to prevent these situations, a sensor for detecting an excessive current is generally utilized so that when an excessive current flows, the current is cut off by controlling switching of the electric power semiconductor device at high speed. However, it is desired that even when the electric power semiconductor device fails due to short-circuiting, the foregoing failure modes such as smoke emission and the like are more securely prevented.

Specifically, for example, when an excessive current cutoff fuse is inserted into the electric power semiconductor device and the battery, the excessive current that flows between the motor-driving inverter and the battery can be prevented.

However, a chip-type excessive current cutoff fuse is expensive. Therefore, there is required an excessive current cutoff means that is inexpensive but can securely cut off an excessive current that could flow when the electric power semiconductor device fails due to short-circuiting.

For example, in after-mentioned PLT 1, the fuse portion is formed by providing a notch in an electrode lead frame protruding from a semiconductor-device module that is sealed with resin and packaged.

CITATION LIST

Patent Literature

PLT 1: JP2003-068967 A

SUMMARY OF INVENTION

Technical Problem

However, in the technology in PLT 1, the fuse portion provided in the electrode lead frame is exposed to the outer air. Accordingly, when the fuse portion is melted by an excessive current, smoke may flow out of the apparatus; in addition, sparks may be scattered and hence combustion reaction utilizing the outer air may cause the apparatus to burn out. Moreover, the material of the melted fuse portion may be scattered to the surroundings and hence the material and a peripheral member may be short-circuited. Moreover, because the fuse portion is formed in such a way that the cross-sectional area thereof is uniform, it is conceivable that the whole fuse portion generates heat and melts. Still moreover, because the heat in the fuse portion is liable to be transferred to the upstream and downstream electrode lead frames of the fuse portion, the time before the fuse portion melts may become long and the transferred heat may damage the electric power semiconductor device.

Thus, there is desired an electric-power conversion apparatus in which smoke emission, a burnout, and short-circuiting can be suppressed even when the fuse portion is melted by an excessive current and in which it is made possible that heat generated in the fuse portion is less likely to be transferred to the electric power semiconductor device.

Solution to Problem

An electric-power conversion apparatus according to the present disclosure includes an electric power semiconductor device, an electrode wiring member connected with a main electrode of the electric power semiconductor device, a case, a fuse portion that is formed in the electrode wiring member and functions as a fuse, a fuse resin member that is a resin member for covering the fuse portion, and a sealing resin member that is a resin member for sealing the electric power semiconductor device, the electrode wiring member, the fuse portion, and the fuse resin member in the case; along a current-flowing direction, the fuse portion includes an upstream-side first step portion whose cross-sectional area is smaller than that of the portion of the electrode wiring member at the upstream side of the fuse portion, a second step portion whose cross-sectional area is smaller than that of the upstream-side first step portion, and a downstream-side first step portion whose cross-sectional area is larger than that of the second step portion but is smaller than that of the portion of the electrode wiring member at the downstream side of the fuse portion.

Advantage of the Invention

In an electric-power conversion apparatus according to the present disclosure, a fuse portion is formed in an electrode wiring member; thus, because no expensive chip-type fuse is provided, the cost of the fuse portion can be reduced. Because a sealing resin member covers the fuse portion and a fuse resin member, the material of the melted fuse portion is prevented from scattering to the outside. Moreover, because the fuse portion and the fuse resin member can be shut down from the outer air, an arc discharge produced at a time of melting can be suppressed from making a combustion reaction proceed and smoke produced at a time of melting can be suppressed from leaking out to the outside. Covering the fuse portion with the fuse resin member makes it possible that the material of the melted fuse portion is suppressed from making contact with the sealing resin member and giving damage to the sealing resin member. Moreover, because the fuse resin member dedicated to the fuse portion is provided, it is made possible to select a resin member made of a material suitable for melting of the fuse portion. Accordingly, smoke emission, a burnout, and short-circuiting can be suppressed even when the fuse portion is melted by an excessive current.

Moreover, because the cross-sectional area of the fuse portion is decreased in a two-step manner, the current density of the second step portion is larger than that of each of the respective current densities of the upstream-side and downstream-side first step portions and the thermal resistance of the second step portion is larger than that of each of the respective thermal resistances of the upstream-side and downstream-side first step portions. Accordingly, it is made possible that the temperature rise in the second step portion is made largest so that the second step portion is melted. Because due to the respective thermal resistances in the upstream-side and downstream-side first step portions, heat in the second step portion is less likely to be transferred to the portions at the upstream and downstream sides of the fuse portion; therefore, it is made possible that the speed of temperature rise in the second step portion is raised and hence the time before melting is shortened, and it is also made possible that heat transfer to the electric power semiconductor device is reduced.

BRIEF DESCRIPTION OF THE DRAWINGS

FIG. 6 is a chart for explaining a temperature distribution in the fuse portion according to Embodiment 1 of the present disclosure;

FIG. 7 is a chart for explaining a temperature distribution in the fuse portion according to a comparative example of the present disclosure;

FIG. 8A, FIG. 8B, FIG. 8C, FIG. 8D, FIG. 8E, FIG. 8F, FIG. 8G are schematic views for explaining variation in the shape of the fuse portion according to Embodiment 1 of the present disclosure;

DESCRIPTION OF EMBODIMENTS

Embodiment 1

Figure 1:
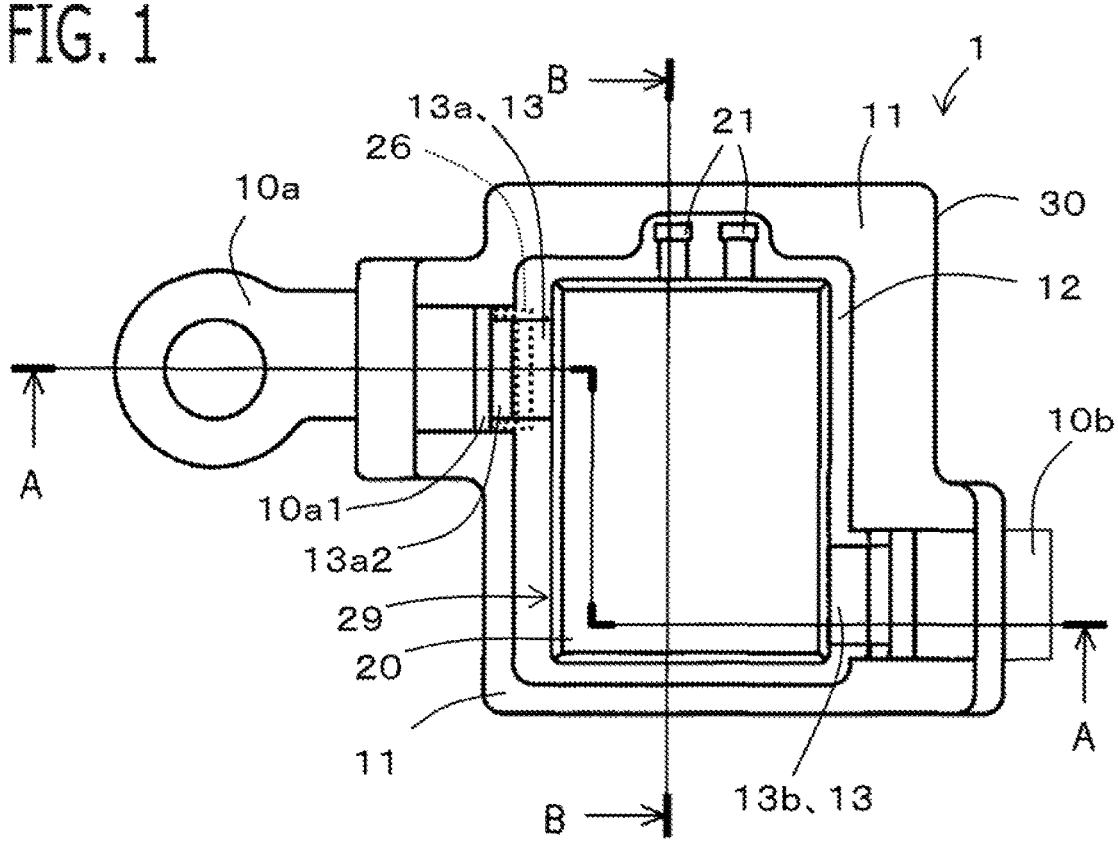
FIG. 1 is a plan view of an electric-power conversion apparatus according to Embodiment 1 of the present disclosure.
Figure 2:
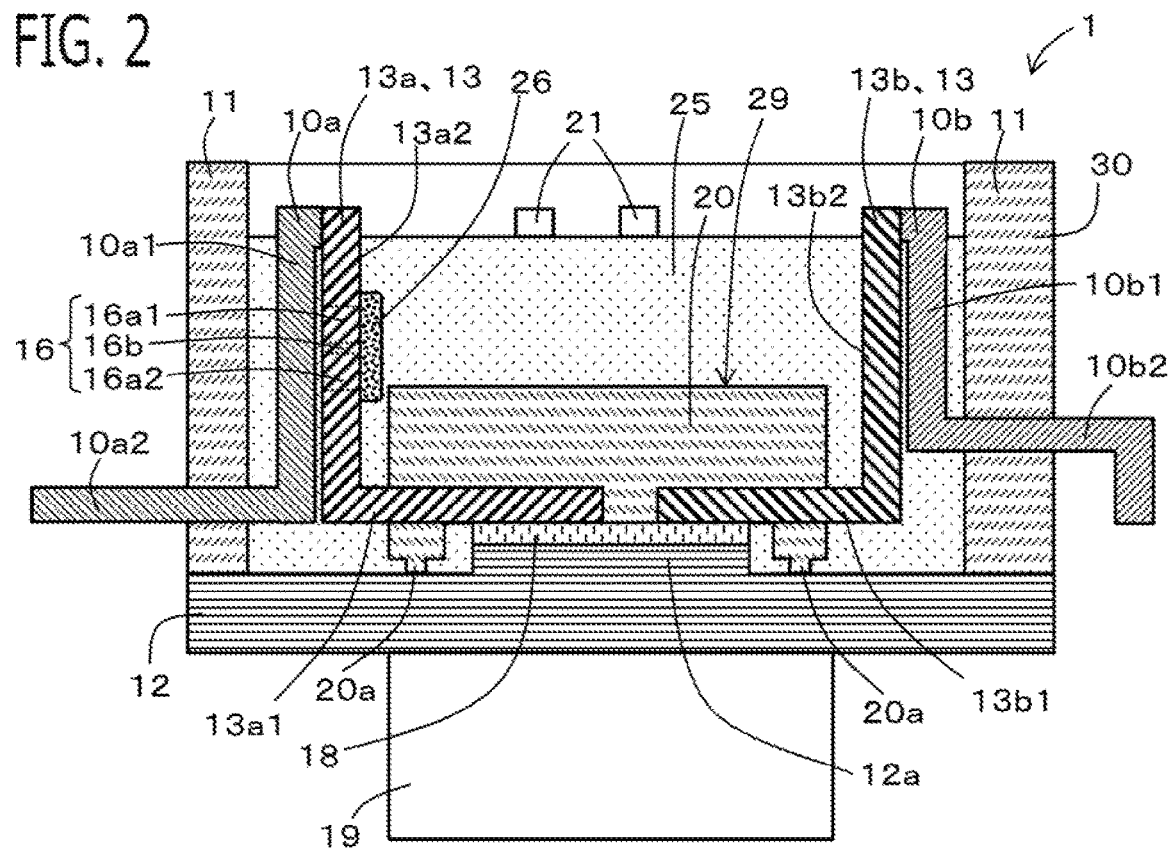
FIG. 2 is a cross-sectional view of the electric-power conversion apparatus according to Embodiment 1 of the present disclosure, when taken at the A-A cross-sectional position in FIG. 1.
Figure 3:
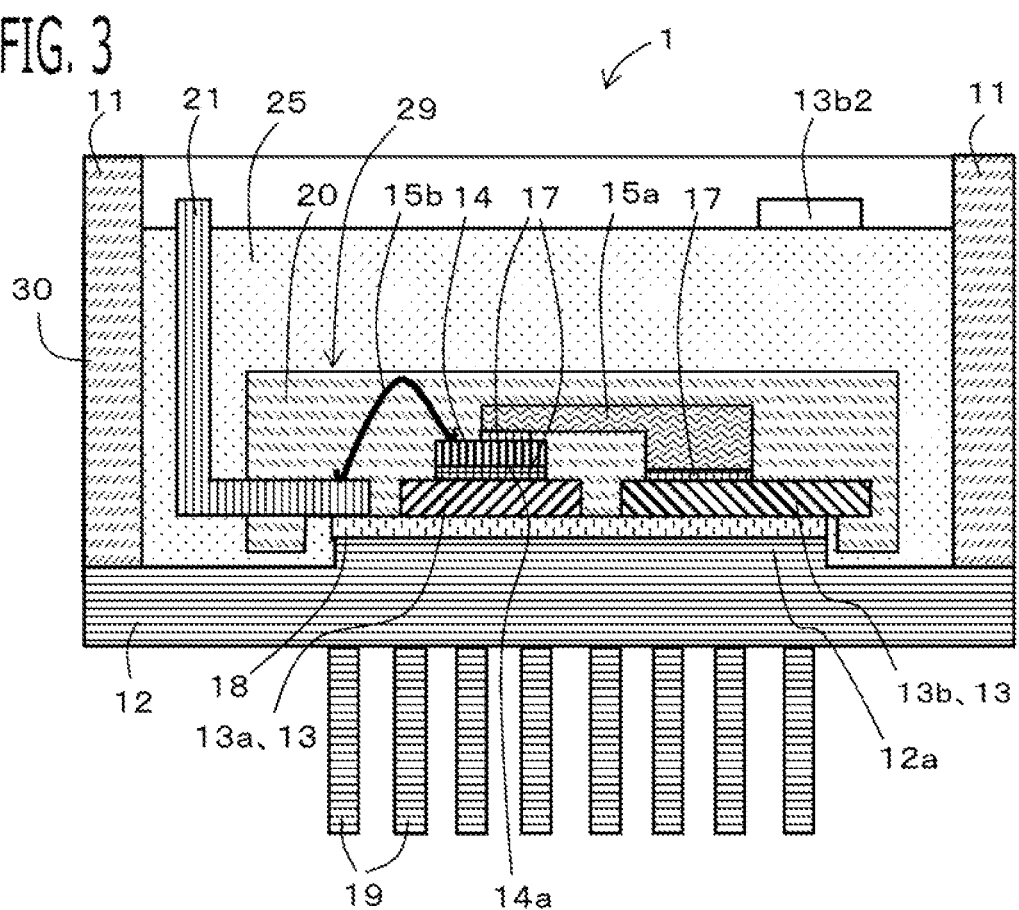
FIG. 3 is a cross-sectional view of the electric-power conversion apparatus according to Embodiment 1 of the present disclosure, when taken at the B-B cross-sectional position in FIG. 1.
Figure 4:
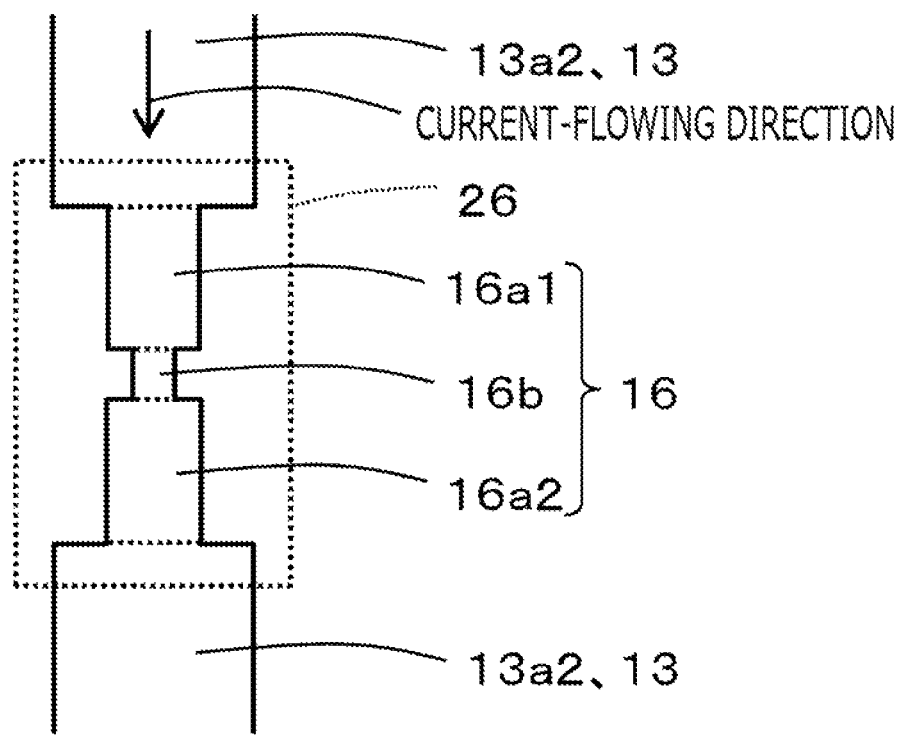
FIG. 4 is a plan view of a fuse portion according to Embodiment 1 of the present disclosure.

An electric-power conversion apparatus 1 according to Embodiment 1 will be explained with reference to drawings. FIG. 1 is a plan view of the electric-power conversion apparatus 1, when viewed from the opening side of a case 30; in order to explain the arrangement of respective components, a sealing resin member 25 is made transparent and is not illustrated. FIG. 2 is a cross-sectional view taken at the A-A cross-sectional position in FIG. 1; FIG. 3 is a cross-sectional view taken at the B-B cross-sectional position in FIG. 1. FIG. 4 is a plan view of a fuse portion 16 viewed from the front. Because each of the foregoing drawings is a schematic diagram, the respective dimensions of each of the members do not coincide with one another in the drawings.

The electric-power conversion apparatus 1 includes an electric power semiconductor device 14, an electrode wiring member 13 connected with the main electrode of the electric power semiconductor device 14, the case 30, and the sealing resin member 25, which is a resin member that seals the respective components, such as the electric power semiconductor device 14 and the like, in the case 30.

<The Case 30>

The case 30 is formed in the shape of a bottomed tube and plays a role as a frame for casting the sealing resin member 25 into a mold. It is assumed that in the case where "in" and "inside" or "out" and "outside" are simply referred to, hereinafter, they each mean the inside or the outside of the case 30. It is assumed that "longitudinal direction" means the direction in which the tubular portion of the case 30 is extended and that "transverse direction" means the direction in which the bottom portion of the case 30 is extended.

The bottom portion of the case 30 is formed of a metal heat sink 12. The heat sink 12 has a role of radiating heat generated in the electric power semiconductor device 14 to the outside. For the heat sink 12, for example, a material such as aluminum, an aluminum alloy, or the like having a thermal conductivity of 20 W/(m·K) or higher is utilized. The heat sink 12 is formed, for example, in the shape of a rectangular flat plate. The heat sink 12 may have a shape other than a rectangular shape. A device-facing protruding portion 12a protruding toward the inside and having a flat-plate shape is provided in the inner surface portion, of the heat sink 12, that faces members at the side of the electric power semiconductor device 14; the inner surface of the device-facing protruding portion 12a abuts on the members at the side of the electric power semiconductor device 14. As illustrated in FIG. 2, two or more flat-plate fins 19, which are arranged spaced a gap apart from one another, are provided on the outer surface of the heat sink 12. The fin 19 is in contact with the outer air; the heat sink 12 radiates heat from the fin 19 toward the outer air. It may be allowed that a water cooling type is utilized.

The tubular portion of the case 30 is formed of an insulating case 11. The insulating case 11 is formed by use of an arbitrary resin material having a high insulating property and a high thermoplasticity, for example, a polyethylene terephthalate (PBT), a polyphenylene sulfide (PPS), a polyetheretherketone (PEEK), or the like.

<The Electric Power Semiconductor Device 14, the Electrode Wiring Member 13>

In the present embodiment, the electric power semiconductor device 14 and electrode lead frames 13, as the electrode wiring members 13, are sealed with a device molding resin 20, which is a resin member; as a result, a packaged semiconductor-device module 29 is obtained. A control lead frame 21 connected with a control terminal of the electric power semiconductor device 14 is also sealed with the device molding resin 20. The electrode lead frames 13 and the control lead frame 21 protrude from the device molding resin 20 to the outside. It is desirable that as the device molding resin 20, a hard resin having a Young's modulus of several GPa or larger is utilized so that the inner device and wirings are protected; for example, an epoxy resin is utilized.

As the electric power semiconductor device 14, a power MOSFET (Metal Oxide Semiconductor Field Effect Transistor) is utilized. It may be allowed that as the electric power semiconductor device 14, another kind of switching device, such as an IGBT (Insulated Gate Bipolar Transistor) with which a diode is connected in an anti-parallel manner, is utilized. The electric power semiconductor device 14 is a device that is utilized in an inverter circuit or a converter circuit for driving an apparatus such as a vehicle driving motor and that controls a rated current of several amperes to several hundreds of amperes. It may be allowed that as the material of the electric power semiconductor device 14, silicone (Si), a silicon carbide (SiC), a gallium nitride (GaN), or the like is utilized.

The electric power semiconductor device 14 is formed in the shape of a rectangular-flat-plate chip; the drain terminal, as a main electrode 14a, is provided in the surface thereof at the side of the heat sink 12, and the source terminal, as a main electrode, is provided in the surface thereof at the side opposite to the side of the heat sink 12 of the case 30. In addition, the gate terminal, as a control terminal, is provided in the surface thereof at the side opposite to the side of the heat sink 12 of the case 30. It may be allowed that as the control terminal, a sensor terminal or the like for detecting a current flowing between the main electrodes or the temperature of the chip is provided.

The drain terminal is connected with a positive-polarity electrode lead frame 13a; the source terminal is connected with a negative-polarity electrode lead frame 13b through the intermediary of an electrode wiring member 15a. Because a large current flows therethrough, the electrode wiring member 15a is formed of, for example, a member obtained by processing a plate material of gold, silver, copper, or aluminum; alternatively, the electrode wiring member 15a is formed through wire bonding or ribbon bonding. Each of the gate terminal and the sensor terminal is connected with the control lead frame 21 through the intermediary of a control wiring member 15b. The control wiring member 15b can be formed, for example, through wire bonding with gold, copper, aluminum or the like or through ribbon bonding with aluminum.

Each of the positive-polarity electrode lead frame 13a and the negative-polarity electrode lead frame 13b is formed in the shape of a plate (a rectangular flat plate, in this example). The respective electrode connection portions, of the electrode lead frames 13a and 13b, that are connected with the main electrodes of the electric power semiconductor device 14 are arranged at the side that is more close to the heat sink 12 than to the electric power semiconductor device 14. The surface, at the side opposite to the side of the heat sink 12, of the electrode connection portion of the positive-polarity electrode lead frame 13a is bonded with a conductive bonding material 17 to the drain terminal on the surface, at the side of the heat sink 12, of the electric power semiconductor device 14. The surface, at the side opposite to the side of the heat sink 12, of the electrode connection portion of the negative-polarity electrode lead frame 13b is bonded with the conductive bonding material 17 to one end of the electrode wiring member 15a, which is formed in an L-shaped manner. The source terminal on the surface, at the side opposite to the side of the heat sink 12, of the electric power semiconductor device 14 is bonded with the conductive bonding material 17 to the other end of the electrode wiring member 15a. The conductive bonding material 17 is formed of, for example, a high-conductivity and high-thermal-conductivity material such as solder, silver paste, a conductive adhesive, or the like.

The surface, at the side of the heat sink 12, of the electrode connection portion of each of the electrode lead frames 13a and 13b is not covered with the device molding resin 20 but is exposed to the outside of the semiconductor-device module 29. Each of the exposed portions of the electrode lead frames 13a and 13b is in contact with the inner surface of the device-facing protruding portion 12a of the heat sink 12, through the intermediary of insulating member 18, which is formed in the shape of a sheet. Heat generated in the electric power semiconductor device 14 is transferred to the heat sink 12, through the intermediary of the respective electrode connection portions of the electrode lead frames 13a and 13b and the insulating member 18. The insulating member 18 is formed of a material having a high thermal conductivity and a high electric insulation property. Thus, the insulating member 18 is formed of, for example, grease, an insulation sheet, or an adhesive made of a resin material such as a silicone resin, an epoxy resin, or an urethane resin that has an insulating property and a heat conductivity of 1 W/(m·K) to several tens of W/(m·K). Moreover, the insulating member 18 can be formed by combining a resin material with another material, such as a ceramic substrate or a metal substrate, that has a high thermal resistance and a high insulating property.

In order to restrict the thickness of the insulating member 18, a protrusion 20a is provided in the device molding resin 20 at the side of the heat sink 12. By pressing the protrusion 20a of the device molding resin 20 against the heat sink 12, the thickness of the insulating member 18 can be restricted by the height of the protrusion 20a; therefore, the insulating property and the heat-conductive property of the insulating member 18 can be managed. For example, in the case of a low-withstanding-pressure automobile utilizing a 12-Volt battery, the creepage distance required for securing a predetermined withstand voltage is substantially 10 μm. Accordingly, in the case of a low-withstanding-pressure automobile, the thickness required for insulation can be decreased; thus, the protrusion 20a of the device molding resin 20 can be shortened and hence the thickness of the electric-power conversion apparatus 1 can be reduced. In the case where the insulating member 18 is made of a material that has a rigidity and whose thickness is changed little by pressing force, the thickness of the insulating member 18 can be managed; thus, the protrusion 20a of the device molding resin 20 is not required.

After protruding from the device molding resin 20, the positive-polarity electrode lead frame 13a extends in the transverse direction along the inner surface of the heat sink 12 in such a manner as to be spaced a gap apart from the inner surface of the heat sink 12; after that, the positive-polarity electrode lead frame 13a bends, and then extends in the longitudinal direction toward the side departing from the heat sink 12 (toward the side of the opening of the case 30). The portion extending in the transverse direction in such a manner as to be spaced a gap apart from the inner surface of the heat sink 12 will be referred to as a positive-polarity lead frame transverse-direction extending portion 13a1; the portion extending in the longitudinal direction toward the side departing from the heat sink 12 will be referred to as a positive-polarity lead frame longitudinal-direction extending portion 13a2. An after-mentioned fuse portion 16 is formed in the positive-polarity lead frame longitudinal-direction extending portion 13a2.

A positive-polarity external connection terminal 10a is inserted into and outserted to the insulating case 11. The positive-polarity external connection terminal 10a has an external connection longitudinal-direction extending portion 10a1 that extends in the longitudinal direction and an external connection transverse-direction extending portion 10a2 that extends in the transverse direction from the end portion, at the side of the heat sink 12, of the external connection longitudinal-direction extending portion 10a1. The opening-side front-end portion of the positive-polarity external connection longitudinal-direction extending portion 10a1 is bonded to the opening-side front-end portion of the positive-polarity lead frame longitudinal-direction extending portion 13a2, through welding, soldering, or the like. A gap is provided between the positive-polarity external connection longitudinal-direction extending portion 10a1 and the positive-polarity lead frame longitudinal-direction extending portion 13a2 excluding the respective front-end bonding portions; therefore, no conduction exists between the positive-polarity external connection longitudinal-direction extending portion 10a1 and the positive-polarity lead frame longitudinal-direction extending portion 13a2 excluding the respective front-end bonding portions. The portion protruding from the case 30 to the outside is connected with other apparatuses, for example, the positive electrode of a DC power source.

Similarly, the negative-polarity electrode lead frame 13b has a negative-polarity lead frame transverse-direction extending portion 13b1, which protrudes from the device molding resin 20 and then extends along the inner surface of the heat sink 12 in such a way as to be spaced a gap apart from the inner surface of the heat sink 12, and a negative-polarity lead frame longitudinal-direction extending portion 13b2, which extends toward the side departing from the heat sink 12.

A negative-polarity external connection terminal 10b is inserted into and outserted to the insulating case 11. The negative-polarity external connection terminal 10b has an external connection longitudinal-direction extending portion 10b1 that extends in the longitudinal direction and an external connection transverse-direction extending portion 10b2 that extends in the transverse direction from the end portion, at the side of the heat sink 12, of the external connection longitudinal-direction extending portion 10b1. The opening-side front-end portion of the external connection longitudinal-direction extending portion 10b1 is bonded to the opening-side front-end portion of the negative-polarity lead frame longitudinal-direction extending portion 13b2, through welding, soldering, or the like. A gap is provided between the negative-polarity external connection longitudinal-direction extending portion 10b1 and the negative-polarity lead frame longitudinal-direction extending portion 13b2 excluding the respective front-end bonding portions; therefore, no conduction exists between the negative-polarity external connection longitudinal-direction extending portion 10b1 and the negative-polarity lead frame longitudinal-direction extending portion 13b2 excluding the respective front-end bonding portions. The portion protruding from the case 30 to the outside is connected with other apparatuses, for example, the negative electrode of the DC power source.

As each of the electrode lead frames 13a and 13b and the external connection terminals 10a and 10b, a high-conductivity and high-thermal-conductivity metal such as copper, a copper alloy, aluminum, an aluminum alloy, or the like is utilized; a large current as large as several amperes to several hundreds of amperes flows therein. It may be allowed that each of the surfaces of the electrode lead frames 13a and 13b is plated with a metal material such as Au, Ni, or Sn.

The control lead frame 21 protrudes from the sealing resin member 25 toward the opening of the case 30 and is connected with a control apparatus for performing on/off-control of the electric power semiconductor device 14.

<The Fuse Portion 16>

The fuse portion 16 that functions as a fuse is formed in the electrode wiring member 13 (the positive-polarity lead frame longitudinal-direction extending portion 13a2, in this example).

As illustrated in FIG. 4, the fuse portion 16 is formed of a portion in the electrode wiring member 13, in which the cross-sectional area is reduced in a two-step manner from each of the upstream portion and the downstream portion, in the flowing direction of a current, of the electrode wiring member 13.

Specifically, as illustrated in FIG. 4 showing a drawing of the fuse portion 16 viewed from the front, the fuse portion 16 includes, along a current-flowing direction, an upstream-side first step portion 16a1 whose cross-sectional area is smaller than that of the portion of the electrode wiring member 13 at the upstream side of the fuse portion 16, a second step portion 16b whose cross-sectional area is smaller than that of the upstream-side first step portion 16a1, and a downstream-side first step portion 16a2 whose cross-sectional area is larger than that of the second step portion 16b but is smaller than that of the portion of the electrode wiring member 13 at the downstream side of the fuse portion 16.

For example, the ratios of the cross-sectional areas of the respective portions are specified as follows:

Cross-sectional area of each of the upstream-side and downstream-side portions:cross-sectional area of each of the upstream-side and downstream-side first step portions:cross-sectional area of the second step portion=7.5:1.5:1. That is to say, the deceasing order of the cross-sectional areas of the respective portions is set in such a way that the cross-sectional area of each of the upstream-side and downstream-side portions>the cross-sectional area of each of the upstream-side and downstream-side first step portions>the cross-sectional area of the second step portion. In this situation, each of the values in the ratios of the cross-sectional areas is an example; thus, the same effect can be obtained as long as the order of the cross-sectional areas is the same.

Figure 5:
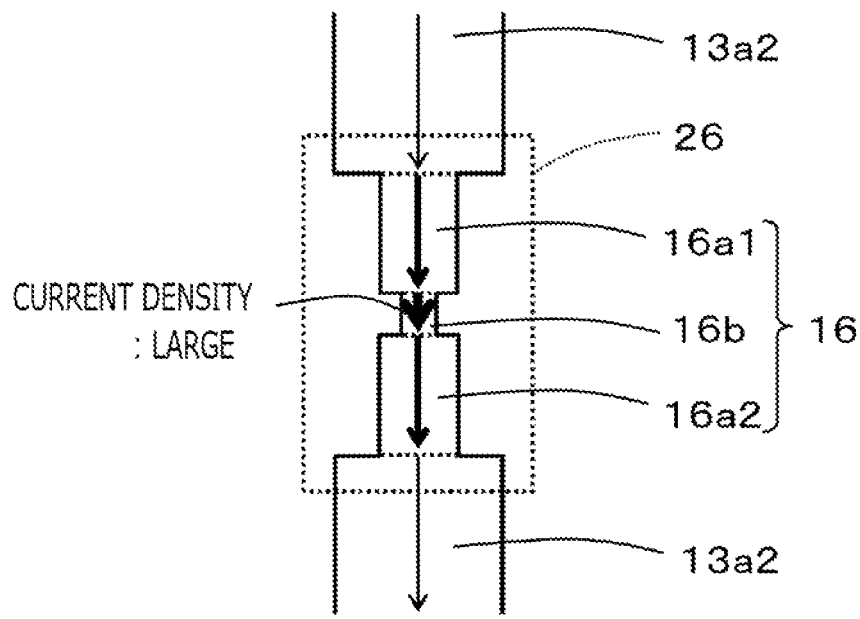
FIG. 5 is a schematic diagram for explaining a current density in the fuse portion according to Embodiment 1 of the present disclosure.

When as described above, the cross-sectional area is decreased in a two-step manner, the current density increases as the cross-sectional area decreases, as illustrated in FIG. 5, and hence the current density in the second step portion 16b becomes the largest. As represented in the equation (1), the thermal resistance increases as the cross-sectional area decreases. For that reason, the heat-generation density increases stepwise; the heat radiation performance is deteriorated stepwise; the temperature rise in the second step portion 16b becomes the largest; then, the second step portion 16b melts.

$$\text{Thermal resistance} = \text{length} \div (\text{heat conductivity} \times \text{cross-sectional area}) \quad (1)$$

FIG. 6 illustrates the temperature distribution in the fuse portion 16 at a time when a current flows. FIG. 6 illustrates the case in the present embodiment, in which the cross-sectional area is decreased in a two-step manner. FIG. 7 illustrates the case where the cross-sectional area is decreased in a one-step manner; although the first step portion is provided, no second step portion is provided. The fuse portion 16 is formed by cutting out the flat-plate electrode lead frame through pressing from the both sides; the width of the second step portion 16b is equal to the plate thickness, of the lead frame, that is as small as can be mass-produced through pressing.

In FIG. 6 according to the present embodiment, the temperature in the second step portion 16b is the highest; in the first step portions 16a1 and 16a2, the temperature gradually decreases as the position departs from the second step portion 16b. Because due to the first step portions 16a1 and 16a2 having a large thermal resistance, heat generated in the second step portion 16b is less likely to be transferred to the portions at the upstream and downstream sides of the fuse portion 16, the speed of the temperature rise in the second step portion 16b is raised; thus, the time before melting can be shortened. Accordingly, when an excessive current flows, the temperature in the second step portion 16b having the smallest cross-sectional area drastically rises in a short time. Then, when the temperature rises up to the melting point of the metal, the second step portion 16b is broken. Moreover, because due to the first step portions 16a1 and 16a2 having a large thermal resistance, heat generated in the second step portion 16b is suppressed from being transferred to the portions at the upstream and downstream sides of the fuse portion 16, damage to the electric power semiconductor device 14, the sealing resin member 25, and the like can be suppressed. Moreover, the relationship between the current and the time before the breakage is adjusted by changing the width and the length of the cutout, so that desired melting characteristics can be obtained. Still moreover, because the fuse portion 16 is provided, the cross-sectional area of the electrode lead frame decreases and the rigidity thereof is reduced, the thermal stress by a temperature change is relaxed and hence it is expected that the reliability of the bonding portion is raised.

In FIG. 7 according to the comparative example, the temperature of the whole fuse portion 16 rises uniformly. Accordingly, when an excessive current flows, the temperature of the fuse portion 16 rises as a whole; thus, the whole fuse portion 16 melts or the melting position varies. Moreover, because the whole temperature rises, the time before melting becomes long; thus, heat transferred to the portions at the upstream and downstream sides of the fuse portion 16 increases. At a time of melting, the whole temperature becomes higher that that illustrated in FIG. 7, and the temperatures of the portions at the upstream and downstream sides of the fuse portion 16 become higher than those in the case illustrated in FIG. 6.

In the present embodiment, the length of the second step portion 16b in the current-flowing direction is shorter than each of the length of the upstream-side first step portion 16a1 in the current-flowing direction and the length of the downstream-side first step portion 16a2 in the current-flowing direction. This configuration makes it possible that the melting portion in the fuse portion 16 is shortened and hence the amount of the melting material is reduced. Because the lengths of the first step portions 16a1 and 16a2 are made long, it is made possible that the thermal resistances are increased and hence the speed of the temperature rise of the second step portion 16b is increased and that the quantity of heat transferred to the portions at the upstream and downstream sides of the fuse portion 16 is reduced. For example, it is desirable that the length of the second step portion 16b in the current-flowing direction is the same as or shorter than the half of (for example, one third of) each of the length of the upstream-side first step portion 16a1 in the current-flowing direction and the length of the downstream-side first step portion 16a2 in the current-flowing direction.

The fuse portion 16 is formed of gold, silver, copper, or aluminum that has a high electrical conductivity. As the fuse portion 16, a material either the same as or different from that of the other portion of the electrode lead frame 13 may be utilized. Although not limited to this, as is the case with the other portion of the electrode lead frame 13, the fuse portion 16 can be formed by punching a copper or copper-alloy flat plate having a thickness of substantially 0.5 mm to 1.5 mm.

The upstream-side first step portion 16a1 and the downstream-side first step portion 16a2 have one and the same cross-sectional area at the respective positions in the current-flowing direction. In the present embodiment, the upstream-side first step portion 16a1 and the downstream-side first step portion 16a2 are formed in the shape of rectangles having one and the same length and cross-sectional area. It may be allowed that the upstream-side first step portion 16a1 and the downstream-side first step portion 16a2 have different lengths and different cross-sectional areas. It may be allowed that the cross section of each of the upstream-side first step portion 16a1 and the downstream-side first step portion 16a2 has not only a rectangular shape but also an arbitrary shape such as a circular shape or an elliptical shape.

The second step portion 16b is formed in the shape of a rectangular parallelepiped. It may be allowed that the shape of the second step portion 16b is arbitrary as long as the cross-sectional area thereof is smaller than that of each of the upstream-side first step portion 16a1 and the downstream-side first step portion 16a2. For example, it may be allowed that as illustrated in FIG. 8A to FIG. 8G, the cross-sectional area is reduced by providing a notch at one side thereof or a notch at each of the both sides thereof or by providing a through-hole therein. The shape of the notch or the through-hole may be not only a rectangle but also an arbitrary shape such as a triangle, a pentagon, a trapezoid, a rhombus, a parallelogram, a circle, or an ellipse. It may be allowed that not only a single but also two or more notches or through-holes are provided. Moreover, it may be allowed that two or more notches or through-holes are arranged at different positions in the longitudinal direction of the wiring in such a way as to be alternate in a zig-zag manner or in such a way as to be at random. Two or more through-holes may be arranged either in the transverse direction of the wiring or in the longitudinal direction thereof <A Fuse Resin Member 26>

A fuse resin member 26, which is a resin member that covers the fuse portion 16, is provided. The fuse resin member 26 is disposed in such a way as to cover at least one side of the second step portion 16b, which is a melting portion. In the present embodiment, as illustrated in FIG. 2, the fuse resin member 26 is configured in such a way as to cover the surface at thickness-direction one side of the fuse portion 16 (in this example, the surface at the side opposite to the side of the positive-polarity external connection terminal 10a). As illustrated in FIG. 4, the fuse resin member 26 is disposed in an area wider than that of the fuse portion 16. It may be allowed that the fuse resin member 26 is disposed in such a way as to cover the surfaces at the transverse-direction both sides of the fuse portion 16.

Before the sealing resin member 25 is filled into the case 30, the fuse resin member 26 is disposed in such a way as to cover the fuse portion 16. The fuse resin member 26 is formed of grease, an insulation sheet, or an adhesive made of a resin material such as a silicone resin, an epoxy resin, or an urethane resin that has a high electric insulation property.

Covering the fuse portion 16 with the fuse resin member 26 makes it possible that the melted material of the fuse portion 16 is suppressed from making contact with the sealing resin member 25 and giving damage to the sealing resin member 25. Moreover, because the fuse resin member 26 dedicated to the fuse portion 16 is provided, it is made possible to select a resin member made of a material suitable for melting of the fuse portion 16.

In the present embodiment, as the fuse resin member 26, a resin member having a Young's modulus lower than that of the sealing resin member 25 is utilized. For example, it is desirable that the Young's modulus of the fuse resin member 26 is in the order of several tens of MPa (megapascals) (e.g., a value between 10 MPa and 30 MPa) and that for example, a rubber material, a silicone rubber, or a silicone gel is utilized. This configuration make it possible that when the fuse portion 16 melts, the melting material that scatters in the form of a plurality of sphere-shaped particles is embedded in the fuse resin member 26, which has a Young's modulus lower than that of the sealing resin member 25 and is soft, so as to be held in such a way as to be dispersed in the fuse resin member 26. Therefore, it is made possible that after melting, the melted material is prevented from maintaining the energization path and hence the energization path is quickly cut off. Moreover, the melted material is prevented from breaking the sealing resin member 25 having a high Young's modulus.

It is desirable that as the fuse resin member 26, there is utilized a silicone resin that has an extinguishing action for an arc discharge that is produced when the fuse portion 16 melts. This configuration makes it possible that an ark discharge is suppressed from continuing energization even after the fuse portion 16 has melted and hence the current is quickly cut off after the melting. Accordingly, damage to the electric power semiconductor device 14, the sealing resin member 25, and the like can be suppressed.

<The Sealing Resin Member 25>

The sealing resin member 25 is a resin member for sealing the electric power semiconductor device 14, the electrode wiring member 13, the fuse portion 16, and the fuse resin member 26 in the case 30. In the present embodiment, the sealing resin member 25 is configured in such a way as to seal the semiconductor-device module 29 in the case 30. The sealing resin member 25 also seals other constituent components such as the insulating member 18 and the external connection terminals 10a and 10b in the case 30. As the sealing resin member 25, for example, a resin material having a high rigidity and a high heat conductivity is utilized. It may be allowed that the sealing resin member 25 is formed of, for example, an epoxy resin, a silicone resin, a urethane resin, PPS, PEEK, or ABS that contains heat transfer fillers. It is desirable that the Young's modulus of the sealing resin member 25 is a value between 1 MPa and 50 GPa and that the heat conductivity thereof is a value between 0.1 W/(m·K) and 20 W/(m·K). The sealing resin member 25 seals the respective constituent components so that the vibration resistance and the environment resistance can be raised.

Because the sealing resin member 25 covers the fuse portion 16 and the fuse resin member 26, the material of the melted fuse portion 16 is prevented from scattering to the outside. Because the fuse portion 16 and the fuse resin member 26 can be shut down from the outer air, an arc discharge produced at a time of melting can be suppressed from making a combustion reaction proceed and smoke produced at a time of melting can be suppressed from leaking out to the outside.

Embodiment 2

Figure 9:
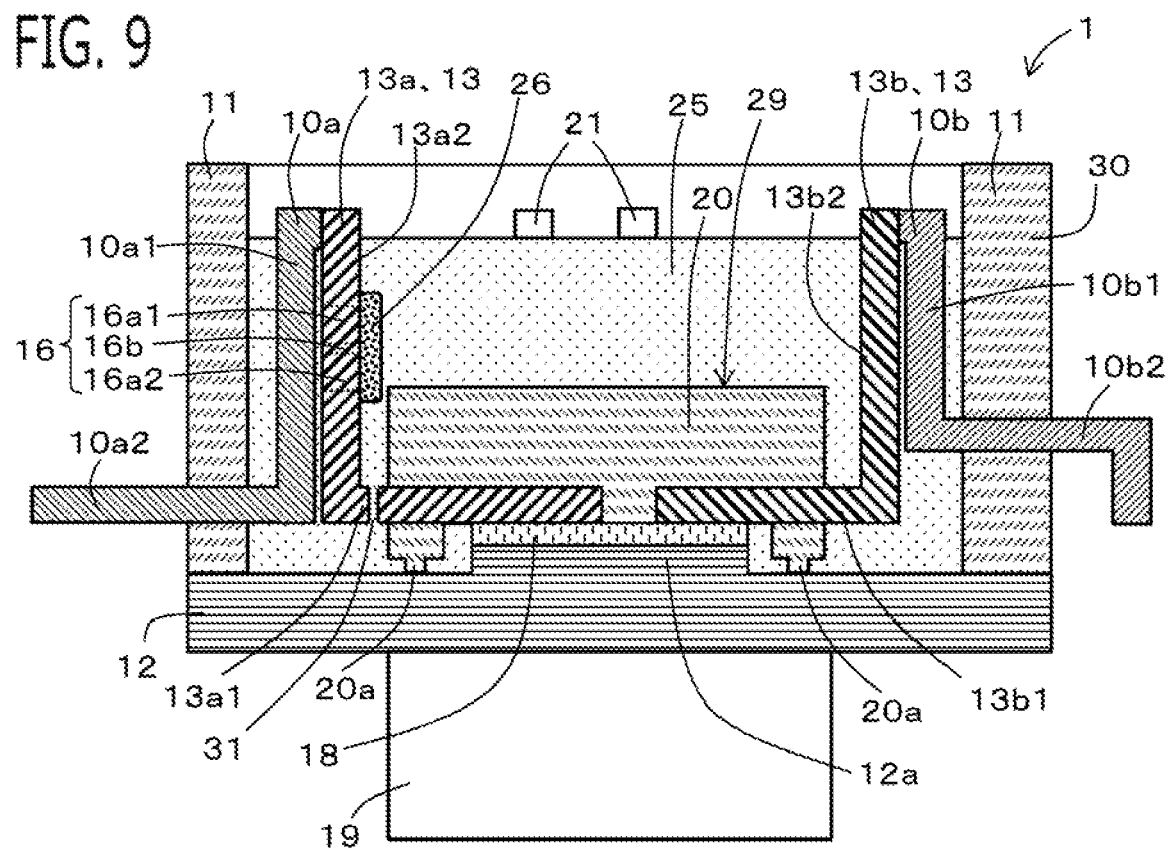
FIG. 9 is a cross-sectional view of an electric-power conversion apparatus according to Embodiment 2 of the present disclosure, when taken at the A-A cross-sectional position in FIG. 1.
Figure 10:
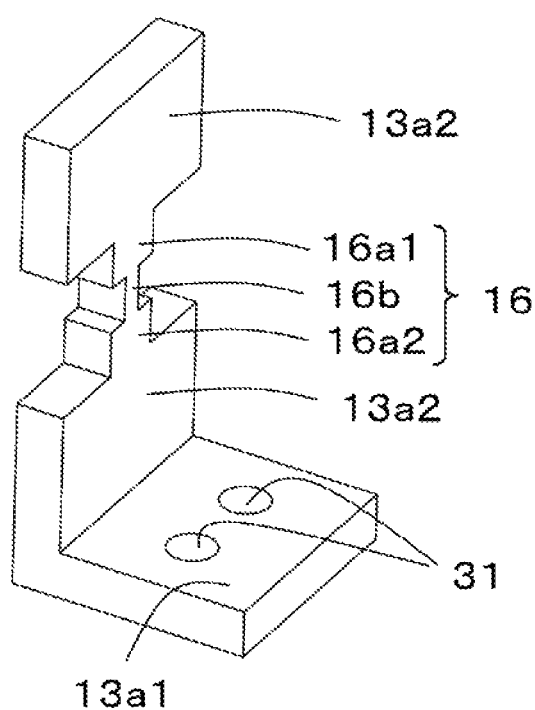
FIG. 10 is a perspective view of an electrode wiring member according to Embodiment 2 of the present disclosure.

Next, an electric-power conversion apparatus 1 according to Embodiment 2 will be explained. The explanation for constituent portions that are the same as those in foregoing Embodiment 1 will be omitted. The basic configuration of the electric-power conversion apparatus 1 according to the present embodiment is similar to that of Embodiment 1; however, part of the configuration of an electrode wiring member 13 is different. FIG. 9 is a cross-sectional view of the electric-power conversion apparatus 1 according to the present embodiment, when taken at the A-A cross-sectional position in FIG. 1. FIG. 10 is a perspective view of a positive-polarity electrode lead frame 13a.

As is the case with Embodiment 1, a fuse portion 16 that functions as a fuse is formed in the electrode wiring member 13 (the positive-polarity electrode lead frame 13a). Unlike Embodiment 1, the electrode wiring member 13 (the positive-polarity electrode lead frame 13a) has a small-cross-sectional-area portion 31, in a portion that is closer to the electric power semiconductor device 14 than to the fuse portion 16, that has a cross-sectional area smaller than that of each of the upstream and downstream portions. The cross-sectional area of the small-cross-sectional-area portion 31 is larger than that of the second step portion 16b of the fuse portion 16.

The small-cross-sectional-area portion 31 is provided in the positive-polarity lead frame transverse-direction extending portion 13a1 that protrudes in the transverse direction from the device molding resin 20. The small-cross-sectional-area portion 31 is formed by providing two cylindrical columnar through-holes, in the transverse direction, that penetrate the electrode lead frame 13a in the thickness direction. It may be allowed that the small-cross-sectional-area portion 31 exists not in the portion protruding from the device molding resin 20 but in the device molding resin 20. As a result, because the device molding resin 20 is filled into the small-cross-sectional-area portion 31, an anchor effect can prevent the separation.

Because the fuse portion 16 is provided, the fuse portion 16 gains heat even when a normal current flows. Accordingly, it is required that the output of the electric-power conversion apparatus 1 is limited so that heat to be transferred to the electric power semiconductor device 14 does not become excessive—this restricts the designing. Because the provision of the small-cross-sectional-area portion 31 increases the thermal resistance, heat generated in the fuse portion 16 is less likely to be transferred to the electric power semiconductor device 14; thus, it is made possible to relax the limitation on the output of the electric-power conversion apparatus 1 in a normal operation.

The small-cross-sectional-area portion 31 may have an arbitrary shape as long as the cross-sectional area thereof is smaller than that of each of the upstream and downstream portions. For example, it may be allowed that as is the case with the second step portion 16b, the cross-sectional area is reduced by providing a notch at one side thereof or a notch at each of the both sides thereof or by providing a through-hole therein. The shape of the notch or the through-hole may be not only a rectangle but also an arbitrary shape such as a triangle, a pentagon, a trapezoid, a rhombus, a parallelogram, a circle, or an ellipse. It may be allowed that not only a single but also two or more notches or through-holes are provided. Moreover, it may be allowed that two or more notches or through-holes are arranged at different positions in the longitudinal direction of the wiring in such a way as to be alternate in a zig-zag manner or in such a way as to be at random. Two or more through-holes may be arranged either in the transverse direction of the wiring or in the longitudinal direction thereof.

Embodiment 3

Figure 11:
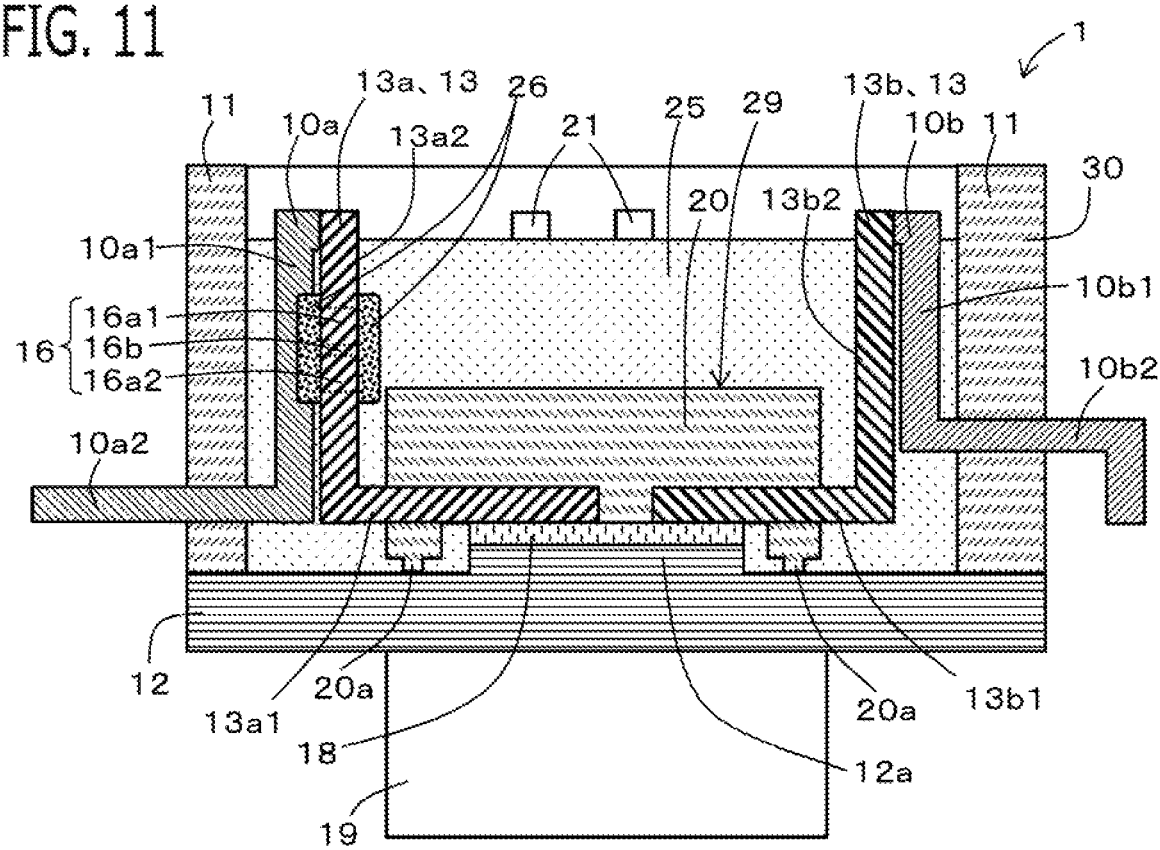
FIG. 11 is a cross-sectional view of an electric-power conversion apparatus according to Embodiment 3 of the present disclosure, when taken at the A-A cross-sectional position in FIG. 1.

Next, an electric-power conversion apparatus 1 according to Embodiment 3 will be explained. The explanation for constituent portions that are the same as those in foregoing Embodiment 1 will be omitted. The basic configuration of the electric-power conversion apparatus 1 according to the present embodiment is similar to that of Embodiment 1; however, part of each of the configurations of a fuse resin member 26 and a positive-polarity external connection terminal 10a is different. FIG. 11 is a cross-sectional view of the electric-power conversion apparatus 1 according to the present embodiment, when taken at the A-A cross-sectional position in FIG. 1.

As is the case with Embodiment 1, the fuse resin member 26 is configured in such a way as to cover the surface at thickness-direction one side of the fuse portion 16 (in this example, the surface at the side opposite to the side of the positive-polarity external connection terminal 10a). However, unlike Embodiment 1, the portion, of the positive-polarity external connection terminal 10a (the external connection longitudinal-direction extending portion 10a1), that faces the fuse portion 16 is recessed toward the side departing from the fuse portion 16; thus, the gap between the fuse portion 16 and the positive-polarity external connection terminal 10a is widened. The fuse resin member 26 is disposed also in this gap; thus, the fuse resin member 26 is configured in such a way as to cover the surface (the surface at the side of the positive-polarity external connection terminal 10a, in this example) at the other side of the fuse portion 16. The fuse resin members 26 are arranged also at the transverse-direction both sides of the fuse portion 16; thus, fuse resin members 26 is disposed in such a way as to cover the whole circumference of the fuse portion 16. Because the fuse resin member 26 having a heat conductivity lower than that of the positive-polarity external connection terminal 10a is disposed between the fuse portion 16 and the positive-polarity external connection terminal 10a, the heat radiation performance of the fuse portion 16 is deteriorated and hence the melting characteristics can be raised. Moreover, it can be prevented that the melting material of the fuse portion 16 makes contact with the positive-polarity external connection terminal 10a and hence the energization path is maintained.

Embodiment 4

Figure 12:
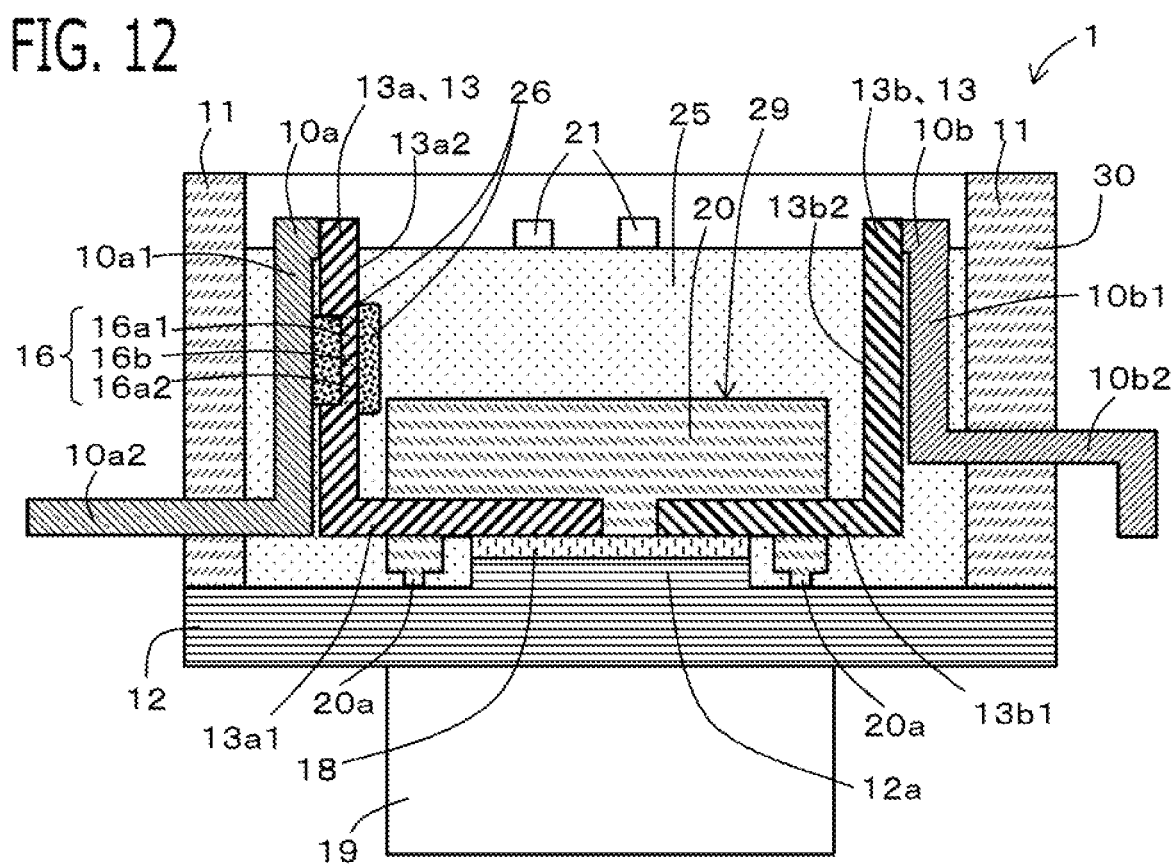
FIG. 12 is a cross-sectional view of an electric-power conversion apparatus according to Embodiment 4 of the present disclosure, when taken at the A-A cross-sectional position in FIG. 1.

Next, an electric-power conversion apparatus 1 according to Embodiment 4 will be explained. The explanation for constituent portions that are the same as those in foregoing Embodiment 1 will be omitted. The basic configuration of the electric-power conversion apparatus 1 according to the present embodiment is similar to that of Embodiment 1; however, part of each of the configurations of a fuse portion 16 and a fuse resin member 26 is different. FIG. 12 is a cross-sectional view of the electric-power conversion apparatus 1 according to the present embodiment, when taken at the A-A cross-sectional position in FIG. 1.

As is the case with Embodiment 1, the fuse resin member 26 is configured in such a way as to cover the surface at thickness-direction one side of the fuse portion 16 (in this example, the surface at the side opposite to the side of the positive-polarity external connection terminal 10a). However, unlike Embodiment 1, the surface at the other side of the fuse portion 16 (the surface at the side of the positive-polarity external connection terminal 10a) is recessed toward the side departing from the positive-polarity external connection terminal 10a. The thickness (plate thickness) of the fuse portion 16 is smaller by the dimension corresponding to this recess than that of each of the portions at the upstream and downstream sides of the fuse portion 16. In addition, the gap between the fuse portion 16 and the positive-polarity external connection terminal 10a is widened by the dimension corresponding to this recess. The fuse resin member 26 is disposed also in this gap; thus, the fuse resin member 26 is configured in such a way as to cover the surface (the surface at the side of the positive-polarity external connection terminal 10a, in this example) at the other side of the fuse portion 16. The fuse resin members 26 are arranged also at the transverse-direction both sides of the fuse portion 16; thus, fuse resin members 26 is disposed in such a way as to cover the whole circumference of the fuse portion 16.

Because the fuse resin member 26 having a heat conductivity lower than that of the positive-polarity external connection terminal 10a is disposed between the fuse portion 16 and the positive-polarity external connection terminal 10a, the heat radiation performance of the fuse portion 16 is deteriorated and hence the melting characteristics can be raised. Moreover, it can be prevented that the melting material of the fuse portion 16 makes contact with the positive-polarity external connection terminal 10a and hence the energization path is maintained. Covering the whole circumference makes it possible that an anchor effect prevents the fuse resin member 26 from being separated and hence the melting performance is stabilized.

Moreover, because the thickness of the fuse portion 16 is reduced, the cross-sectional area of the fuse portion 16 can be decreased; thus, the time before melting can be shortened and heat transfer to the portions at the upstream and downstream sides of the fuse portion 16 can be reduced. As a result, it is made possible to relax the limitation on the output of the electric-power conversion apparatus 1 in a normal operation.

The method of reducing the thickness of the fuse portion 16 includes, for example, a method of utilizing a thin different material in the fuse portion 16, a method of performing press working, and a method of performing cutting; however, the method therefor is not limited thereto.

Embodiment 5

Figure 13:
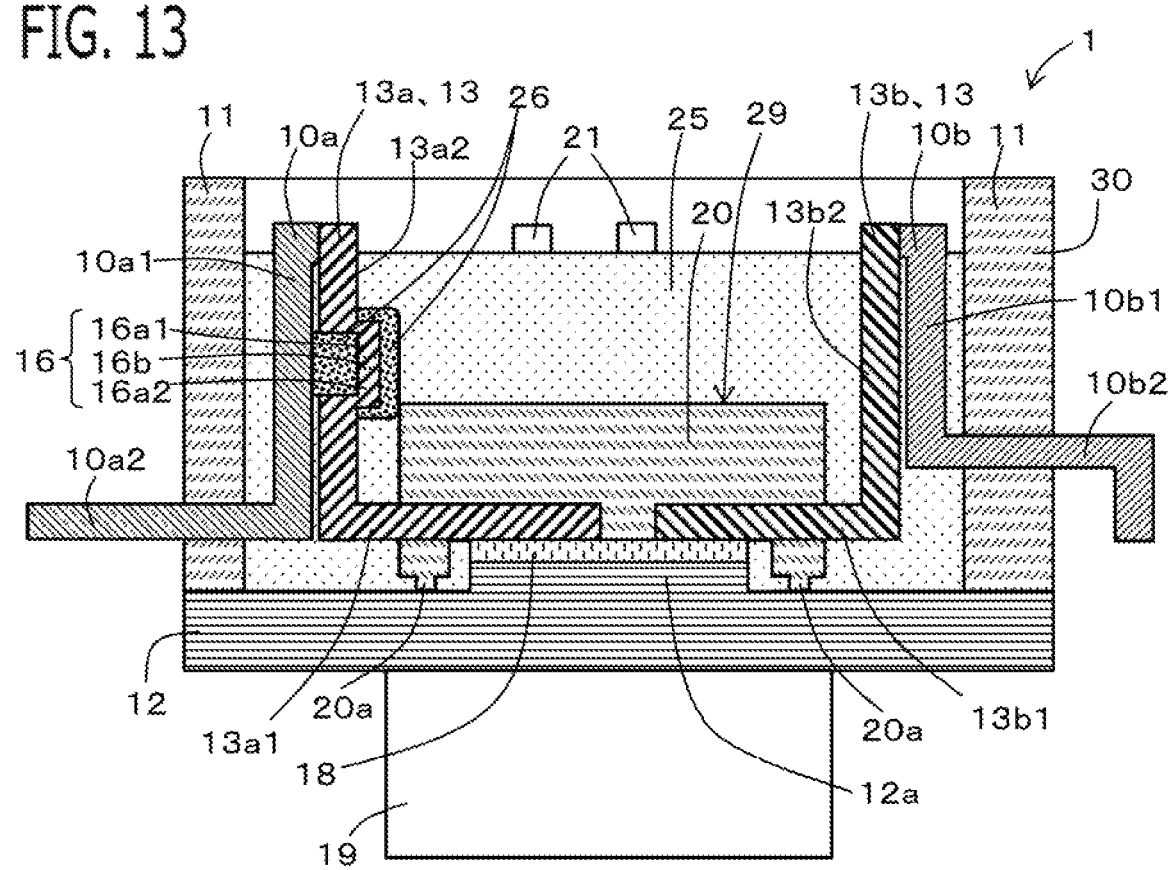
FIG. 13 is a cross-sectional view of an electric-power conversion apparatus according to Embodiment 5 of the present disclosure, when taken at the A-A cross-sectional position in FIG. 1.

Next, an electric-power conversion apparatus 1 according to Embodiment 5 will be explained. The explanation for constituent portions that are the same as those in foregoing Embodiment 1 will be omitted. The basic configuration of the electric-power conversion apparatus 1 according to the present embodiment is similar to that of Embodiment 1; however, part of each of the configurations of a fuse portion 16 and a fuse resin member 26 is different. FIG. 13 is a cross-sectional view of the electric-power conversion apparatus 1 according to the present embodiment, when taken at the A-A cross-sectional position in FIG. 1.

As is the case with Embodiment 1, the fuse resin member 26 is configured in such a way as to cover the surface at thickness-direction one side of the fuse portion 16 (in this example, the surface at the side opposite to the side of the positive-polarity external connection terminal 10a). However, unlike Embodiment 1, the fuse portion 16 protrudes from the portions of the electrode wiring member 13 at the upstream and downstream sides of the fuse portion 16 toward the thickness-direction one side (in the direction departing from the positive-polarity external connection terminal 10a, in this example). The fuse portion 16 is formed in the portion, of the electrode wiring member 13, that protrudes in the direction departing from the positive-polarity external connection terminal 10a in such a way as to be bent in the shape of a square C. The thickness (plate thickness) of the protruding fuse portion 16 is smaller than that of each of the portions at the upstream and downstream sides of the fuse portion 16. The gap between the fuse portion 16 and the positive-polarity external connection terminal 10a is widened by the dimension corresponding to this protrusion. The fuse resin member 26 is disposed also in this gap; thus, the fuse resin member 26 is configured in such a way as to cover the surface (the surface at the side of the positive-polarity external connection terminal 10a, in this example) at the other side of the fuse portion 16. The fuse resin members 26 are arranged also at the transverse-direction both sides of the fuse portion 16; thus, fuse resin members 26 is disposed in such a way as to cover the whole circumference of the fuse portion 16.

Because the fuse resin member 26 having a heat conductivity lower than that of the positive-polarity external connection terminal 10a is disposed between the fuse portion 16 and the positive-polarity external connection terminal 10a, the heat radiation performance of the fuse portion 16 is deteriorated and hence the melting characteristics can be raised. Moreover, it can be prevented that the melting material of the fuse portion 16 makes contact with the positive-polarity external connection terminal 10a and hence the energization path is maintained. The thickness of the fuse resin member 26 can be adjusted by adjusting the protruding amount of the fuse portion 16, and the effect can be made appropriate. Covering the whole bending portion makes it possible that an anchor effect prevents the fuse resin member 26 from being separated and hence the melting performance is stabilized. Moreover, the provision of the bending portion relaxes the thermal stress produced by a temperature change, and hence it can be expected that the reliability of the bonding portion is raised.

Moreover, because the thickness of the fuse portion 16 is reduced, the cross-sectional area of the fuse portion 16 can be decreased; thus, the time before melting can be shortened and heat transfer to the portions at the upstream and downstream sides of the fuse portion 16 can be reduced. As a result, it is made possible to relax the limitation on the output of the electric-power conversion apparatus 1 in a normal operation.

The method of making the fuse portion 16 protrude in the shape of a square C and reducing the thickness thereof includes, for example, a method of utilizing a thin different material in the fuse portion 16, a method of performing press working, and a method of performing cutting; however, the method therefor is not limited thereto.

Other Embodiments

Lastly, other embodiments of the present disclosure will be explained. Each of the configurations of embodiments to be explained below is not limited to be separately utilized but can be utilized in combination with the configurations of other embodiments as long as no discrepancy occurs.

(1) In each of the foregoing embodiments, there has been explained, as an example, the case where the electric power semiconductor device 14 and electrode lead frames 13, as the electrode wiring members 13, are sealed with the device molding resin 20, which is a resin member, so that the semiconductor-device module 29 is obtained. However, embodiments of the present disclosure are not limited to the foregoing case. In other words, it is not required that the electric power semiconductor device 14 and the electrode wiring member 13 are sealed with the device molding resin 20 so that the semiconductor-device module 29 is packaged. That is to say, it may be allowed that the electric power semiconductor device 14, the electrode wiring member 13, and the like that are not sealed with the device molding resin 20 are sealed, in the case 30, with the sealing resin member 25. In this case, it may be allowed that the electrode wiring member 13 is a bus bar or the like and that the fuse portion 16 is formed in a portion of any one of the positive-polarity electrode wiring member and the negative-polarity electrode wiring member that are sealed with the sealing resin member 25.

(2) In each of the foregoing embodiments, there has been explained, as an example, the case where the fuse portion 16 is formed in the positive-polarity electrode lead frame 13a (the lead frame longitudinal-direction extending portion 13a2). However, embodiments of the present disclosure are not limited to the foregoing case. In other words, it may be allowed that the fuse portion 16 is formed in an arbitrary portion, as long as it is a portion of the electrode wiring member 13 that is connected with the main electrode of the electric power semiconductor device 14 and is sealed with the sealing resin member 25. For example, it may be allowed that the fuse portion 16 is formed in the negative-polarity electrode lead frame 13b, the positive-polarity lead frame transverse-direction extending portion 13a1, or any one of the positive-polarity external connection terminal 10a and the negative-polarity external connection terminal 10b.

(3) In each of the foregoing embodiments, there has been explained, as an example, the case where the electric-power conversion apparatus 1 is provided with a single electric power semiconductor device 14 (switching device). However, embodiments of the present disclosure are not limited to the foregoing case. That is to say, it may be allowed that the electric-power conversion apparatus 1 is provided with two or more electric power semiconductor devices. For example, it may be allowed that between a positive-polarity electrode wiring member and a negative-polarity electrode wiring member, two switching devices are connected in series with each other and the fuse portion 16 is formed in the positive-polarity or negative-polarity electrode wiring member. In addition, it may be allowed that between a positive-polarity electrode wiring member and a negative-polarity electrode wiring member, there is disposed a bridge circuit in which two or more sets of series circuits, each of which includes two switching devices, are connected in parallel with one another and that the fuse portion 16 is formed in the electrode wiring member for each of the two or more sets of series circuits. It may be allowed that all of or part of the electric power semiconductor devices 14 are diodes.

In the scope of the present disclosure, the embodiments thereof can freely be combined with one another and can appropriately be modified or omitted.

REFERENCE SIGNS LIST

1: electric-power conversion apparatus
13: electrode wiring member
14: electric power semiconductor device
16: fuse portion
16a1: upstream-side first step portion
16a2: downstream-side first step portion
16b: second step portion
20: device molding resin
25: sealing resin member
26: fuse resin member
29: semiconductor-device module
30: case
31: small-cross-sectional-area portion

The invention claimed is:

1. An electric-power conversion apparatus comprising:
an electric power semiconductor device;
an electrode wiring member connected with a main electrode of the electric power semiconductor device;
a case;
a fuse portion that is formed in the electrode wiring member and functions as a fuse;
a fuse resin member that is a resin member that covers the fuse portion;
a sealing resin member that is a resin member that seals the electric power semiconductor device, the electrode wiring member, the fuse portion, and the fuse resin member in the case,
wherein along a current-flowing direction, the fuse portion includes, an upstream-side first step portion whose cross-sectional area is smaller than that of a portion of the electrode wiring member at an upstream side of the fuse portion, a second step portion whose cross-sectional area is smaller than that of the upstream-side first step portion, and a downstream-side first step portion whose cross-sectional area is larger than that of the second step portion but is smaller than that of a portion of the electrode wiring member at a downstream side of the fuse portion,
wherein the electrode wiring member is formed in the shape of a plate,
wherein a plate thickness of the fuse portion is thinner than that of each of the respective portions of the electrode wiring member at the upstream side and the downstream side of the fuse portion,
wherein the electric-power conversion apparatus further comprises a connection terminal that has a parallel wiring part arranged in parallel with the fuse portion with an interval,
wherein the plate thickness of the fuse portion is thinner than that of each of the respective portions of the electrode wiring member, by a surface of the fuse portion, facing toward the parallel wiring part, being recessed in the electrode wiring member toward a side of the fuse portion that faces away from the parallel wiring part, and
wherein the fuse resin member is arranged between the fuse portion and the parallel wiring part.

2. The electric-power conversion apparatus according to claim 1,
wherein the electric power semiconductor device and an electrode lead frame, as the electrode wiring member, are sealed with a device molding resin that is a resin member, so that a semiconductor-device module is obtained, and
wherein the fuse portion is formed in a portion of the electrode lead frame protruding from the device molding resin to an outside.

3. The electric-power conversion apparatus according to claim 1, wherein a length of the second step portion in the current-flowing direction is shorter than each of a length of the upstream-side first step portion in the current-flowing direction and a length of the downstream-side first step portion in the current-flowing direction.

4. The electric-power conversion apparatus according to claim 3, wherein the length of the second step portion in the current-flowing direction is the same as or shorter than half of each of the length of the upstream-side first step portion in the current-flowing direction and the length of the downstream-side first step portion in the current-flowing direction.

5. The electric-power conversion apparatus according to claim 1, wherein the upstream-side first step portion and the downstream-side first step portion have one and the same cross-sectional area at respective positions thereof in the current-flowing direction.

6. The electric-power conversion apparatus according to claim 1, wherein the fuse resin member covers at least one side of the second step portion.

7. The electric-power conversion apparatus according to claim 1, wherein as the fuse resin member, there is utilized a silicone resin that has an extinguishing action for an arc discharge that is produced when the fuse portion melts.

8. The electric-power conversion apparatus according to claim 1, wherein the fuse resin member has a Young's modulus lower than that of the sealing resin member.

9. The electric-power conversion apparatus according to claim 1, wherein a Young's modulus of the fuse resin member is in the order of several tens of megapascals.

10. An electric-power conversion apparatus comprising:
an electric power semiconductor device;
an electrode wiring member connected with a main electrode of the electric power semiconductor device;
a case;
a fuse portion that is formed in the electrode wiring member and functions as a fuse;
a fuse resin member that is a resin member that covers the fuse portion; and a sealing resin member that seals the electric power semiconductor device, the electrode wiring member, the fuse portion, and the fuse resin member in the case, wherein along a current-flowing direction, the fuse portion includes, an upstream-side first step portion whose cross-sectional area is smaller than that of a portion of the electrode wiring member at an upstream side of the fuse portion, a second step portion whose cross-sectional area is smaller than that of the upstream-side first step portion, and a downstream-side first step portion whose cross-sectional area is larger than that of the second step portion but is smaller than that of a portion of the electrode wiring member at a downstream side of the fuse portion, and in a portion of the electrode wiring member that is closer to the electric power semiconductor device than to the fuse portion, the electrode wiring member has a small-cross-sectional-area portion whose cross-sectional area is smaller than that of each of the upstream and downstream sides of the fuse portion thereof.

11. An electric-power conversion apparatus comprising:
an electric power semiconductor device;
an electrode wiring member connected with a main electrode of the electric power semiconductor device;
a case;
a fuse portion that is formed in the electrode wiring member and functions as a fuse;
a fuse resin member that is a resin member that covers the fuse portion;
a sealing resin member that is a resin member that seals the electric power semiconductor device, the electrode wiring member, the fuse portion, and the fuse resin member in the case, wherein along a current-flowing direction, the fuse portion includes, an upstream-side first step portion whose cross-sectional area is smaller than that of a portion of the electrode wiring member at an upstream side of the fuse portion, a second step portion whose cross-sectional area is smaller than that of the upstream-side first step portion, and a downstream-side first step portion whose cross-sectional area is larger than that of the second step portion but is smaller than that of a portion of the electrode wiring member at a downstream side of the fuse portion, wherein the fuse portion protrudes toward one side of a thickness-direction thereof from the respective portions of the electrode wiring member at the upstream and downstream sides of the fuse portion, wherein the electric-power conversion apparatus further comprises a connection terminal that has a parallel wiring part arranged in parallel with the fuse portion with an interval on an opposite side of the one side of the thickness-direction of the fuse portion, and the fuse resin member is arranged between the fuse portion and the parallel wiring part.

* * * * *